United States Patent [19]

Holzer et al.

[11] Patent Number: 5,614,851

[45] Date of Patent: Mar. 25, 1997

[54] HIGH-ACCURACY, LOW-POWER PEAK-TO-PEAK VOLTAGE DETECTOR

[75] Inventors: Reuven Holzer, Herzlia; Rafael Fried, Caesarea, both of Israel

[73] Assignee: National Semiconductor Corporation, Santa Clara, Calif.

[21] Appl. No.: 386,554

[22] Filed: Feb. 9, 1995

[51] Int. Cl.[6] .................................................. H03K 5/153
[52] U.S. Cl. ............................... 327/58; 327/50; 327/62; 327/79
[58] Field of Search ................................... 327/58, 61, 62, 327/79, 91, 94, 309, 321, 180, 60, 50

[56] References Cited

U.S. PATENT DOCUMENTS 4,620,114  10/1986  Moon ......................................... 327/58

OTHER PUBLICATIONS

"IBM Technical Disclosure Bulletin", Hoffman et al., vol. 25, No. 12 May 1983, pp. 6725–6727.

*Primary Examiner*—Timothy P. Callahan
*Assistant Examiner*—Dinh T. Le

[57] ABSTRACT

An accurate peak-to-peak detector, readily implemented in CMOS and consuming low power. The peak-to-peak detector includes a clamp portion (circuit) followed by a peak-detect portion (circuit), each of which circuits includes at least one active component (e.g., transistor). The clamp circuit receives an input signal having an alternating current (AC) component via an input coupling capacitor which outputs a voltage on a line to the peak-detect circuit. The clamp circuit includes either a passive load element (e.g., a resistor), or an active load element (e.g., a CMOS transistor), so that the clamp circuit bleeds current from the input coupling capacitor, and any slow drift in the DC level of the input voltage will be followed. The peak-detect circuit follows the voltage output by the coupling capacitor, and includes either a passive load element (e.g., a resistor) or an active load element (e.g., a CMOS transistor), to bleed current from the peak-detected signal so that decreases in peak-to-peak amplitude of the input voltage will be followed. Various CMOS embodiments are described which use only N-Channel transistors, only P-Channel transistors, or both N-Channel and P-Channel transistors.

19 Claims, 7 Drawing Sheets

PRIOR ART

5,614,851

HIGH-ACCURACY, LOW-POWER PEAK-TO-PEAK VOLTAGE DETECTOR

TECHNICAL FIELD OF THE INVENTION

The invention relates to integrated circuits, more particularly to CMOS integrated circuits, and still more particularly to AC signal detection circuits such as a peak-to-peak voltage detector implemented on CMOS integrated circuits.

BACKGROUND OF THE INVENTION

Peak-to-peak voltage detection circuits receive an input signal voltage ($V_{IN}$) and produce an output voltage ($V_{OUT}$) which is proportional to the peak-to-peak magnitude of an alternating current (AC) component of the input signal voltage. For example, if such a circuit were to receive as an input signal voltage a sinusoidal signal with a 3 volt peak-to-peak (AC) amplitude superimposed upon a 2 volt direct current (DC) voltage, the peak-to-peak detection circuit would produce an output voltage proportional to the 3 volt peak-to-peak amplitude of the sinusoidal (AC) component of the input signal. (Ideally, a peak-to-peak voltage detector is insensitive to any DC component of the input signal voltage.) If the amplitude of the sinusoidal component of the input signal voltage were reduced to 1.5 Volts peak-to-peak (Vpp), the output voltage of the peak-to-peak voltage detector would be reduced by half (relative to the output voltage produced for the 3 Vpp sinusoid). If the exemplary 2 Volt DC component of the input signal were gradually reduced to zero volts, the output of the peak-to-peak voltage detector would, ideally, be substantially unaffected.

FIG. 1 is a schematic diagram of a prior-art peak-to-peak voltage detector 100 such as may be found in many electrical engineering textbooks. The peak-to-peak voltage detector 100 has two principal portions (circuits): a clamp portion 102 and a peak-detector portion 104. An input signal voltage $V_{IN}$ is AC-coupled via an input capacitor 110 to the clamp portion 102 of the peak-to-peak voltage detector 100. The clamp portion 102 is implemented by the input capacitor 110, a resistor 120 and a diode 130, all having a common terminal at a voltage $V_J$ at their junction. The voltage $V_J$ is prevented from falling more than one "diode drop" below zero volts (i.e., more than the forward conducting voltage of the diode 130 below ground, or zero volt, level) which effectively causes the voltage $V_J$ at the junction of the capacitor 110, the resistor 120 and the diode 130 to equal the AC component of the input signal voltage $V_{IN}$, biased such that the DC level of the negative-most excursions of the AC component are set approximately one diode drop below zero volts. This is known as "clamping" the input voltage to one diode drop below zero volts.

In the peak-detector portion 104 of the peak-to-peak voltage detector 100, the "clamped" junction voltage $V_J$ is applied, via a diode 140, to an RC circuit having a "hold" capacitor 150 and a resistor 160. When the "clamped" junction voltage $V_J$ rises more than one diode drop above a voltage on the "hold" capacitor 150, the diode 140 conducts, permitting current to flow, and the voltage ($V_{OUT}$) on the hold capacitor rises until the clamped junction voltage falls below one diode drop above $V_{OUT}$. The resistor 160 continually bleeds current away from the capacitor 150, causing $V_{OUT}$ to fall slowly towards 0 volts so that decreasing peak-to-peak signal amplitude at the input $V_{IN}$ will cause a corresponding decrease in the output voltage $V_{OUT}$. The values of the hold capacitor 150 and the resistor 160 are chosen such that the rate of decay of the voltage $V_{OUT}$ is very slow compared to the rate of change of the input voltage $V_{IN}$. Effectively, then, the output of the peak detect portion 104 of the peak-to-peak detector 100 rises rapidly to a peak level, then decays slowly away from that level.

In order for such a peak-to-peak voltage detector to function properly, the impedance of the input capacitor 110 must be substantially smaller than the resistance of the resistor 120 at the lowest AC frequencies of interest in the input signal voltage. That is, where $f_L$ is the lowest frequency of interest in the input signal voltage $V_{IN}$:

$$1/(2\pi f_L C_{IN}) << R_{IN}$$

where $C_{IN}$ is the capacitance value of the input capacitor 110 and $R_{IN}$ is the resistance value of the resistor 120. Further, the hold capacitor 150 must be smaller in value than the input capacitor 110, so that following inequality is satisfied:

$$1/(2\pi R_{HOLD} C_{HOLD}) << f_L$$

Although simple in concept, the peak-to-peak voltage detector 100 is subject to many sources of error. The voltage drops across the two diodes 130 and 140 appear as a negative DC shift in the output voltage (voltage on the hold capacitor 150) $V_{OUT}$. Further, the circuit will not function properly for AC input signal components less than the sum of the two diode (130, 140) drops. The diodes 130 and 140 have junction capacitances and series resistances which contribute to error. As a result, the peak-to-peak voltage detector 100 is not very accurate, and is best suited only to input signals having relatively large magnitudes (i.e. several volts AC peak-to-peak).

Because of the diodes used, numerous error sources, and the nature and relative sizes of the components required, and because the circuit lacks suitability to small-signal applications, the peak-to-peak detector 100 is not well suited to application in Complementary Metal-Oxide-Silicon (CMOS) integrated circuits.

FIG. 2 is a block diagram of another prior-art peak-to-peak voltage detector 200 which is considerably more accurate, but considerably more complicated than the peak-to-peak detector 100 of FIG. 1. An input buffer amplifier 210 buffers an input signal voltage $V_{IN}$ and passes it to two separate peak voltage detectors: a positive peak detector 220 and a negative peak detector 230. The positive peak detector 220 detects and holds the value of the positive peak excursions of the input signal voltage $V_{IN}$ at an output thereof. The negative peak detector 230 detects and holds the value of the negative peak excursions of the input signal voltage $V_{IN}$ at an output thereof. If there is a DC (or very low frequency component) to the input signal voltage $V_{IN}$, it will be present in equal amounts at the outputs of the positive and negative peak detectors 220 and 230. A summing block 240 is used to subtract the output of the negative peak detector 230 from the output of the positive peak detector 220, yielding an output $V_{OUT}$ equal to the voltage difference between the positive peak excursions and negative peak excursions of the input signal voltage $V_{IN}$—in other words, $V_{OUT}$ equals the peak-to-peak value of the input signal voltage $V_{IN}$.

Although considerably more accurate than the peak-to-peak voltage detector 100, the peak-to-peak voltage detector 200 is much more complicated, requiring an input buffer amplifier 210, two separate peak detectors 220 and 230, and a summing block 240. On an integrated circuit, this complexity requires a substantial amount of chip area. Further, the circuit is not particularly well suited to applications targeted to low power consumption, since its large number of active components tends to result in relatively high power consumption.

SUMMARY OF THE INVENTION

It is, therefore, an object of the present invention to provide an improved peak-to-peak voltage detector.

It is another object of the present invention to provide a peak-to-peak detector which is well suited to use in applications having relatively small input signal levels.

It is another object of the present invention to provide a peak-to-peak voltage detector which is well suited to implementation in CMOS integrated circuits.

It is another object of the present invention to provide a peak-to-peak voltage detector which exhibits high accuracy.

It is another object of the present invention to provide a peak-to-peak voltage detector which requires a minimal number of components.

It is another object of the present invention to provide a peak-to peak voltage detector which, when implemented on an integrated circuit, requires a relatively small amount of chip area.

It is another object of the present invention to provide a peak-to-peak voltage detector which is well suited to low-power applications, such as in digital answering machines, personal digital recorders, and the like.

According to an aspect of the invention, a peak-to-peak voltage detector includes an active clamp circuit (or portion) followed by an active peak-detector circuit (or portion). An input voltage (signal having an AC component) to the peak-to-peak voltage detector is AC coupled into the clamp portion via a capacitor and is clamped by a transistor clamp circuit to a known voltage level so that the clamped voltage is a "replica" of the input voltage with its negative-going peaks set to a voltage level equal to the known voltage. A (passive) resistive or an active current source (transistor) load bleeds current from the clamp circuit so that slow drift in the DC level of the input voltage will be followed. The peak-detector portion "follows" the positive going peaks of the clamped voltage to yield a positive output voltage which is equal to the difference between the negative-going and positive-going peaks of the input voltage, offset by the known voltage. A (passive) resistive or an active current source (transistor) load bleeds current from the peak-detected signal so that decreases in peak-to-peak amplitude of the input voltage will be followed. The clamp and the peak-detector (follower) circuits employ a threshold voltage-canceling technique to eliminate any offset voltages in the output voltage (i.e., the known voltage is zero). Further, by using an active clamp circuit, followed by an active peak-detect circuit, and by eliminating significant offset voltage sources, very small peak-to-peak input voltage magnitudes can accurately be measured.

According to another aspect of the invention, the clamp circuit clamps the positive-going peaks of the input signal voltage and the peak-detector circuit follows the negative-going peaks of the input signal voltage to provide a negative output voltage equal to the difference (magnitude of the excursion) between the negative-going and positive-going peaks of the input signal.

The clamp circuit operates by utilizing a field effect transistor (FET) in a source follower configuration biased with a gate voltage equal to its gate-threshold voltage. This causes the FET to clamp the capacitively-coupled input signal to ground, with minimal offset voltage error. A load connected to the source terminal of the clamping FET can be either a resistor (passive load) or another FET (active load) connected in a constant current configuration.

The peak-detector circuit operates by utilizing another FET in a source follower configuration with a capacitive load. A resistor or active FET current-source load, connected in parallel with (across) the capacitive load, bleeds current away from the capacitor, causing a voltage across the capacitive load to "droop" slowly over time. Since the source follower can drive in only one direction, it effectively transfers the "peaks" of the clamped voltage to the capacitor. After a peak has occurred and the input voltage to the peak-detector (following) circuit falls off, the resistor or FET constant-current load across the capacitor causes the "held" peak voltage to decay slowly.

Due to its low offset, high accuracy and suitability to small signals, the peak-to-peak voltage detector is well suited to applications which would otherwise be difficult, if not impossible, to implement with the peak-to-peak detector 100 of FIG. 1. Further, the simplicity of the present invention, its small bias currents, and its use of components which are readily available in CMOS integrated circuitry make it ideally suited to low-cost and low-power integrated circuit applications, particularly CMOS applications.

The invention is particularly useful in applications such as in analog/mixed mode circuits, in crystal oscillators, in audio modulation (AM) demodulators (in communications chips), in automatic gain control (AGC) circuits, or as a minimum level comparator in receivers.

In an embodiment of the invention, the clamp circuit is implemented by two N-Channel CMOS transistors, and the peak-detector is implemented by two N-Channel CMOS transistors. In this embodiment, in each of the clamp and peak-detect circuits, one of the two transistors functions as an "active" load.

In an alternate embodiment of the invention, a load resistor is substituted for the active load N-Channel transistor in the clamp circuit.

In another alternate embodiment of the invention, a load resistor is substituted for the active load N-Channel transistor in the peak-detect circuit.

In a further alternate embodiment of the invention, a load resistor is substituted for the active load N-Channel transistor in the clamp circuit, and another load resistor is substituted for the active load N-Channel transistor in the peak-detect circuit.

In additional embodiments of the invention, P-Channel (CMOS) transistors are substituted for the N-Channel (CMOS) transistors in the clamp and peak-detect circuits.

Additionally, an embodiment of the invention is disclosed wherein both N-Channel and P-Channel CMOS transistors are employed.

According to an aspect of the invention, a bias voltage generator is provided for the various embodiments of the invention.

Other objects, features and advantages of the present invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

Figure 3:
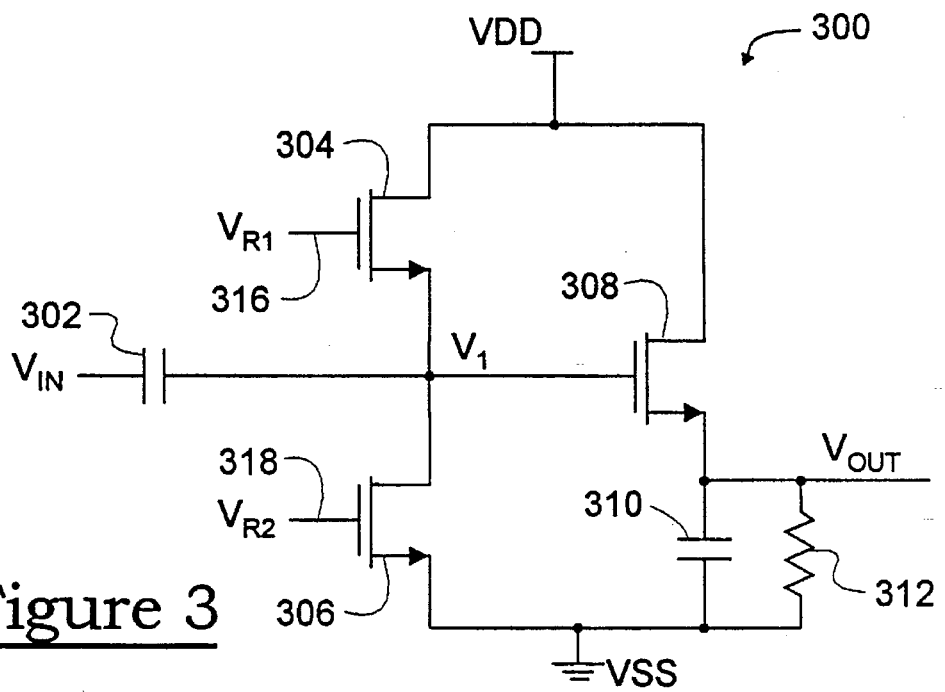
FIG. 3 is a schematic diagram of one embodiment of a peak-to-peak voltage detector using N-channel transistors, according to the invention.

FIG. 3 is a schematic diagram of an embodiment of a peak-to-peak voltage detector 300, according to the invention. In a manner similar to the simple prior art passive peak-to-peak detector 100 described hereinabove with respect to FIG. 1, the peak-to-peak voltage detector 300 includes a clamp portion (circuit) and a peak-detect portion (circuit), the clamp portion being followed by the peak-detect portion and forming the peak-to-peak voltage detector of the present invention. The "clamp" circuit is implemented with N-channel transistors 304 and 306, and an input capacitor 302. The purpose of the input capacitor 302 is to AC-couple an input voltage $V_{IN}$ to the clamp circuit, to provide a clamped voltage $V_1$. As shown in FIG. 3, transistor 304 is connected as a voltage follower referenced to a fixed reference voltage $V_{R1}$ at input line 316 such that the clamped voltage $V_1$ cannot fall below $(V_{R1}-V_{T304})$, where $V_{T304}$ is the gate threshold voltage for transistor 304. When the gate-to-source voltage of transistor 304 exceeds $V_{T304}$, the transistor 304 conducts, and "clamps" the voltage $V_1$ to a minimum level of about $(V_{R1}-V_{T304})$. When the voltage $V_1$ exceeds $(V_{R1}-V_{T304})$, transistor 304 is in "cutoff", that is, it does not conduct. Transistor 306 has its gate biased with a fixed reference voltage $V_{R2}$ such that the transistor 306 acts as a constant current load which "pulls" the voltage $V_1$ constantly towards 0 Volts when transistor 304 is in cutoff. When the voltage $V_1$ falls below $(V_{R1}-V_{T304})$, transistor 304 conducts more current than transistor 306, and the circuit "clamps" $V_1$ to $(V_{R1}-V_{T304})$.

The peak-detect portion of the peak-to-peak voltage detector 300, includes an N-channel transistor 308, a hold capacitor 310 and a resistor 312. The resistor 312 and capacitor 310 are connected in parallel with one another, each with one end connected to ground (VSS, or zero volts). The transistor 308 is connected as a voltage follower with $V_1$ as its input voltage and with its output connected to the parallel combination of the resistor 312 and the hold capacitor 310 to provide an output voltage $V_{OUT}$. When the voltage $V_1 > V_{OUT}+V_{T308}$ (where $V_{T308}$ is the gate threshold voltage of transistor 308) and voltage $V_{IN}$ rises, transistor 308 charges the hold capacitor 310 and supplies current to the resistor 312. When the voltage $V_1$ drops below $V_{OUT}+V_{T308}$, the hold capacitor 310 holds the peak voltage value reached on $V_{OUT}$. The resistor 312 causes the held peak voltage on $V_{OUT}$ to drop exponentially towards zero volts, at a time constant equal to $R_{312}C_{310}$, where $R_{312}$ and $C_{310}$ are the resistance and capacitance values of the resistor 312 and the hold capacitor 310, respectively.

Fixed reference voltage $V_{R1}$ is selected to bias the gate of transistor 304 at a DC level of slightly greater than $V_{T304}+V_{T306}$. ($V_{T304}$ and $V_{T306}$ are the gate threshold voltages of transistors 304 and 306, respectively. Since both transistors are preferably similarly constructed N-channel transistors, $V_{T304}$ and $V_{T306}$ should be about equal). When transistor 304 conducts current, its gate-to-source drop $V_{GS}$ is very close to (very slightly greater than) $V_{T304}$. Fixed reference voltage $V_{R2}$ at input line 318 controls the constant current through transistor 306, and is set to slightly greater than $V_{T306}$; just high enough to cause the transistor 306 to conduct a small amount of current (known as "weak inversion"). In this mode of operation, the gate-to-source voltage of transistor 306 is very slightly greater than its gate threshold voltage, $V_{T306}$. This small current through transistor 306 is meant to slowly discharge the input capacitor 302, thereby causing voltage $V_1$ to drop slowly towards 0 volts. This slow negative drift of $V_1$ ensures that the voltage at $V_1$ will be clamped by transistor 304 at the negative-going peaks of an AC voltage at the input.

The role of transistor 304 in clamping the voltage $V_1$ is such that when $V_1$ drops below $V_{R1}-V_{T304}$, transistor 304 begins to conduct current. Any further drop in $V_1$ increases $V_{GS304}$, which causes transistor 304 to conduct more current into $V_1$ (thereby charging input capacitor 302), preventing $V_1$ from dropping any further. In this mode of operation, the current balance in the "clamp" circuit is:

$$I_{304}=I_{306}+C_{302}dV_1/dt$$

where $I_{304}$ is the current into $V_1$ by transistor 304, $I_{306}$ is the constant current drawn from $V_1$ by transistor 306 and $C_{302}$ is the capacitance value of the input capacitor 302. The equation for $I_{304}$ set forth above assumes that the gradient of the voltage $V_1$ is negligible compared to the gradient of the input voltage $V_{IN}$, hence the current in the input capacitor 302 is dependent on the gradient of the voltage $V_1$ alone. (Hence, the term $dV_{IN}$ could readily be substituted for the term $dV_1$, in the equation for $I_{304}$.) If transistor 304 conducts heavily (strong inversion), $V_1$ drops below $V_{R1}-V_{T304}$ and becomes:

$$V_1 = V_{R1} - V_{T304} - V_{ON304}$$

where:

$$V_{ON304} = (2(I_{306} + C_{302}dV_1/dt)/(\beta(W/L)))^{1/2}$$

where $\beta$, W, and L are parameters related to transistor construction and are well known and understood by those of ordinary skill in the art (e.g., W and L are linear dimensions associated with the transistors, and $\beta$ is a factor related to the process technology for fabricating the transistors). As was the case in the equation for $I_{304}$, a substitution can be made in the equation set forth above for $V_{ON304}$ in that the term $dV_{IN}$ could readily be substituted for the term $dV_1$.

After the voltage $V_1$ reaches a negative extreme and begins to rise, $V_1$ rises along with it, causing the transistor 304 to enter into cutoff. The voltage rise in $V_1$, however, is slightly less than the rise in $V_{IN}$ because of stray capacitances from the gate of transistor 308, and p-n junction capacitance in the drain of transistor 306 and in the source of transistor 304. Defining the amount of stray capacitance as "Cs", the time in which the voltage $V_1$ is continuously rising as $\Delta t$, and the change in $V_{IN}$ during this time as $\Delta V_{IN}$, the voltage $V_1$ will rise with the voltage difference $\Delta V_{IN}$, and the amount voltage $V_1$ will rise ($\Delta V_1$) is given by:

$$\Delta V_1 = \Delta V_{IN}(C_{302}/(C_{302}+Cs)) - I_{306}\Delta t(C_{302}+Cs)$$

The peak value of $\Delta V_1$ represents the peak-to-peak value of the input signal $V_1$, with an error component. The error component of $\Delta V_1$ is composed of a linear scale factor error $(C_{302}/(C_{302}+Cs))$ and a constant error (offset) due to the "on" voltage of transistor 304 ($V_{ON304}$). This error component ($\Delta V_1$(error)) is expressed by:

$$\Delta V_1(\text{error}) = \Delta V_{IN}(Cs/(C_{302}+Cs)) + I_{306}\Delta t(C_{302}+Cs) + V_{ON304}$$

During the time that voltage $V_1$ is rising, transistor 308 begins to charge the hold capacitor 310, thus raising the voltage at $V_{OUT}$. The voltage $V_{OUT}$ during this time is:

$$V_{OUT} = V_1 - V_{T308} - V_{ON308}$$

where $V_{T308}$ is the gate threshold voltage of transistor 308 and $V_{ON308}$ is the "on" gate-source voltage of transistor 308 (i.e., the gate-source voltage over and above $V_{T308}$). $V_{ON308}$ represents an additional source of error in $V_{OUT}$. Assuming that transistor 308 always conducts current in a weak inversion or moderate inversion mode, which it should, $V_{ON308}$ is very small. If (or when) transistor 308 conducts in a strong inversion mode, then $V_{ON308}$ is determined in the same manner described above with respect to $V_{ON304}$, and is given by the following equation.

$$V_{ON308} = (2((C_{310}dV_{OUT}/dt) + (V_{OUT}/R_{312}))/(\beta(W/L)))^{1/2}$$

After the voltage $V_{IN}$ reaches a positive peak and begins to drop again, $V_1$ drops along with it, and transistor 308 enters into cutoff as $V_1$ drops below $V_{OUT}-V_{T308}$. The voltage $V_{OUT}$ begins to drop slowly with a time constant equal to $C_{310}R_{312}$. As this occurs, the peak-to-peak value of $V_{IN}$ is maintained (offset by a small error (Vptp(error)) by the hold capacitor 310. The peak-to-peak voltage Vptp of the input voltage $V_{IN}$ is given by:

$$Vptp = V_{OUT}(\max) - V_{BIAS} - Vptp(\text{error})$$

A useful approximation for Vptp can be derived by omitting the error factor (Vptp(error)).

$V_{BIAS}$ is the steady-state (DC) component of the voltage at $V_{OUT}$ when the signal at the input $V_{IN}$ is held constant (DC), and is given by:

$$V_{BIAS} = V_{R1} - V_{T304} - V_{T308}$$

When implemented on an integrated circuit, all of the transistors 304, 306, and 308 will have nearly identical construction and nearly identical threshold voltages (preferably, as nearly as process limitations will permit). Substituting a common threshold voltage $V_{TN}$ for all of the transistors, and based on the fact that $V_{R1}$ is approximately equal to $V_{T304}+V_{T306}$, the previous equation for $V_{BIAS}$ becomes:

$$\begin{aligned} V_{BIAS} &= (V_{T302} + V_{T304}) - V_{T304} - V_{T308} \\ &= V_{T302} - V_{T308} \\ &\approx V_{TN} - V_{TN} = 0 \end{aligned}$$

Evidently, the DC offset $V_{BIAS}$ in the peak-to-peak output voltage is very small.

The total error in the peak-to-peak output voltage is obtained by combining all of the sources of error. This can be obtained by adding $V_{ON308}$ to $\Delta V_1$(error) as follows:

Total error $= \Delta V_1(\text{error}) + V_{ON308} = \Delta V_{IN}(Cs/(C_{302}+Cs)) + I_{306}\Delta t(C_{302}+Cs) + V_{ON304} + V_{ON308}$ Ordinarily, the stray capacitances (Cs) will be very small as compared to the value of the input capacitor 302. Accordingly, the voltage division error term $\Delta V_{IN}(Cs/(C_{302}+Cs))$ will be negligibly small. The current through transistor 306 is chosen such that it does not have significant impact on frequency components of interest. Therefore, the current error term $I_{306}\Delta t(C_{302}+Cs)$ can, for practical intents and purposes, be ignored at higher frequencies. Also, assuming that component values are chosen such that transistors 304 and 308 need only conduct small amounts of current, the $V_{ON304}$ and $V_{ON308}$ terms will be very small, except for large signal swings. As a result, on-state voltages do not contribute significantly to peak-to-peak voltage error at small signal levels.

Figure 1:
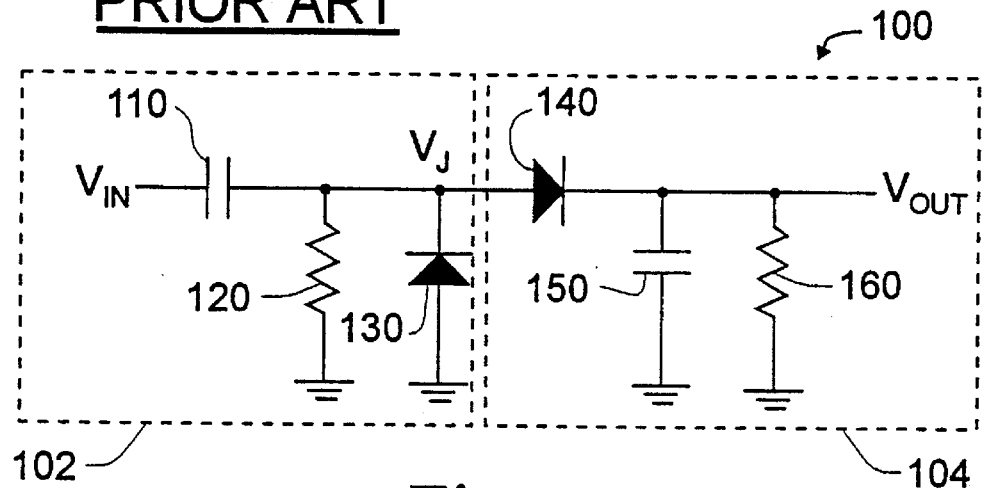
FIG. 1 is a schematic diagram of a prior-art peak-to-peak voltage detector.
Figure 2:
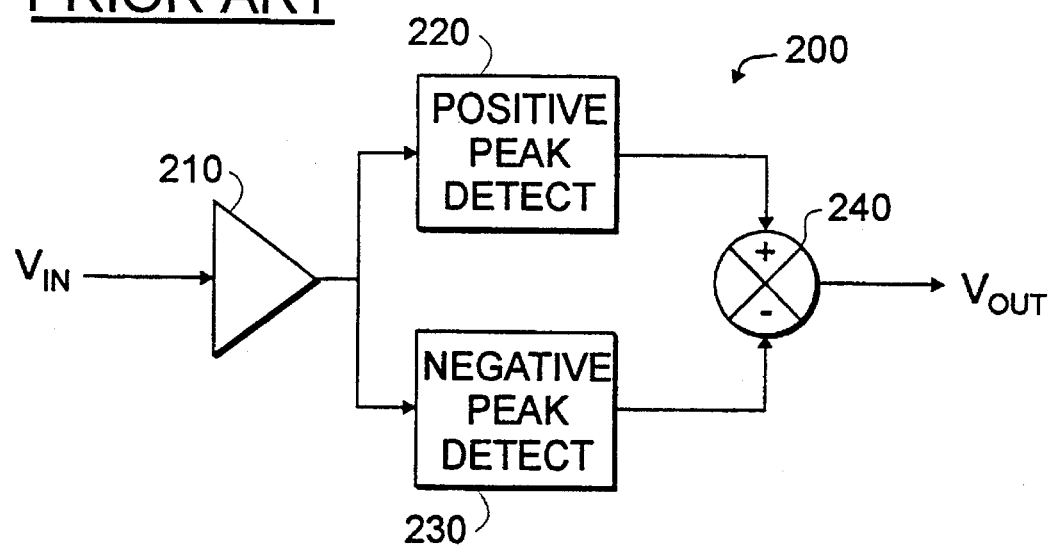
FIG. 2 is a block diagram of another prior-art peak-to-peak voltage detector.

Due to its low offset, high accuracy and suitability to small signals, the peak-to-peak voltage detector 300 is well suited to applications which would otherwise be difficult (or impossible) to implement, for example, with the peak-to-peak detector 100 of FIG. 1. Further, the simplicity of the present invention, its small bias currents, and its use of components which are readily available in CMOS integrated circuitry make it ideally suited to low-cost and low-power integrated circuit applications, particularly CMOS applications.

Figure 4:
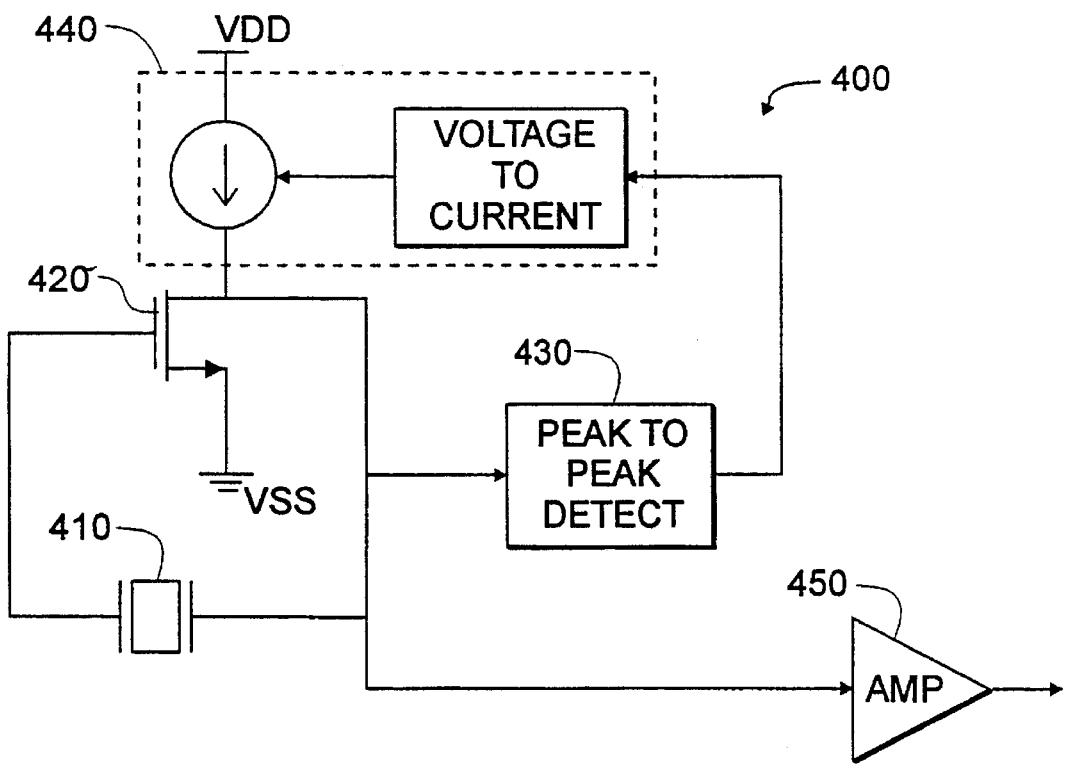
FIG. 4 is a block diagram of a low-power, high-efficiency crystal oscillator employing the peak-to-peak voltage detector of the present invention.

An example of an application for the peak-to-peak detector of the present invention is given in FIG. 4, which is a block diagram of a high-efficiency, low-power crystal oscillator 400. A crystal 410 is connected in a feedback configuration around a field effect transistor 420. An output signal at a drain of the field effect transistor 420 is fed to a peak-to-peak detector 430 of the type shown and described hereinabove with respect to FIG. 3. The output of the peak-to-peak detector 430 controls a voltage-to-current converter 440 which provides a bias current for the field effect transistor 420. The signal at the drain of the field effect transistor 420 is buffered by an amplifier 450 to provide an oscillator output signal.

Figure 5:
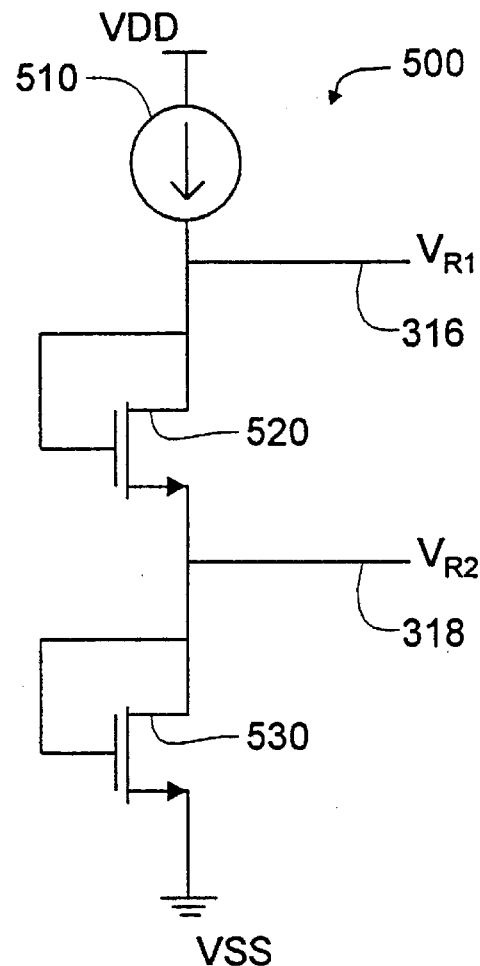
FIG. 5 is a schematic diagram of a bias voltage generator for the peak-to peak voltage detector of FIG. 3, and for other N-Channel embodiments of the peak-to-peak detector such as are shown in FIGS. 6, 7 and 8, according to the present invention.

FIG. 5 is a schematic diagram of a bias voltage generator 500 for the peak-to peak voltage detector 300 of FIG. 3, and for other embodiments of the peak-to-peak detector shown and described hereinbelow with respect to FIGS. 6, 7, and 8, according to the invention. A constant current source 510 provides a bias current source. The constant current source 510 feeds into a drain terminal of a first N-channel transistor 520, to which a gate terminal of the transistor 520 is also connected. A source terminal of the transistor 520 is connected to a drain terminal of a second N-channel transistor 530, to which a gate terminal of the transistor 530 is also connected. A source terminal of the second transistor 530 connects to ground (0 Volts; VSS). Connected in this manner, the drain-to-source voltage of each of the transistors 520 and 530 is just slightly greater than its gate threshold voltage, such that the reference voltage $V_{R2}$ at input line 318 provided at the drain of the second transistor 530 is approximately equal to the gate threshold voltage of the second transistor 530. The reference voltage $V_{R1}$ at input line 316 provided at the drain of the first transistor 520 is approximately equal to the sum of the gate-threshold voltages of the first and the second transistors 520 and 530. The constant current source 510 provides a current equal to the current desired, for example, in the transistor 306 (see FIG. 3). The currents will match due to "current mirroring", a technique which is well known and understood by those of ordinary skill in the art.

Figure 6:
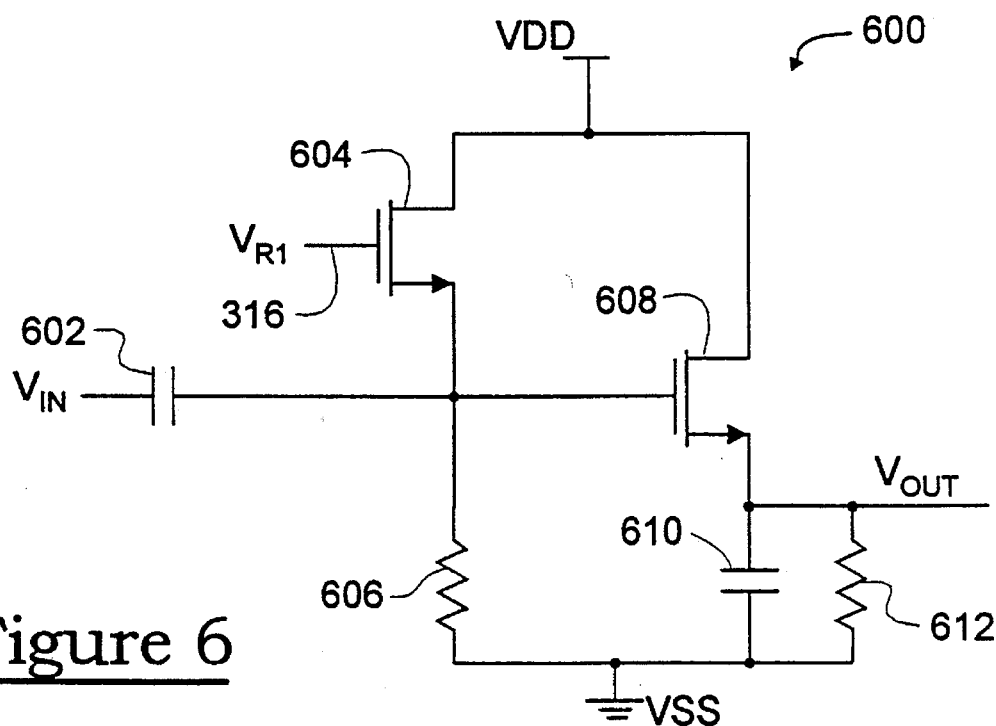
FIG. 6 is a schematic diagram of another embodiment of a peak-to-peak voltage detector using N-Channel transistors, according to the invention.

FIG. 6 is a schematic diagram of another embodiment of a peak-to-peak voltage detector 600 using N-Channel transistors, which is identical to the peak-to-peak detector 300 in all respects except that the constant current load transistor 306 in FIG. 3 is replaced with a resistor 606. A clamping portion of the circuit is implemented by an input capacitor 602, an N-Channel transistor 604 and the resistor 606. The peak-detect portion of the peak-to-peak detector 600 is identical to the peak-detect portion of the peak-to-peak detector 300 of FIG. 3, and is implemented by an N-channel transistor 608, a hold capacitor 610 and a resistor 612. Those of ordinary skill in the art will immediately recognize that the peak-to-peak detector 600 will function in much the same manner as the peak-to-peak detector 300.

Figure 7:
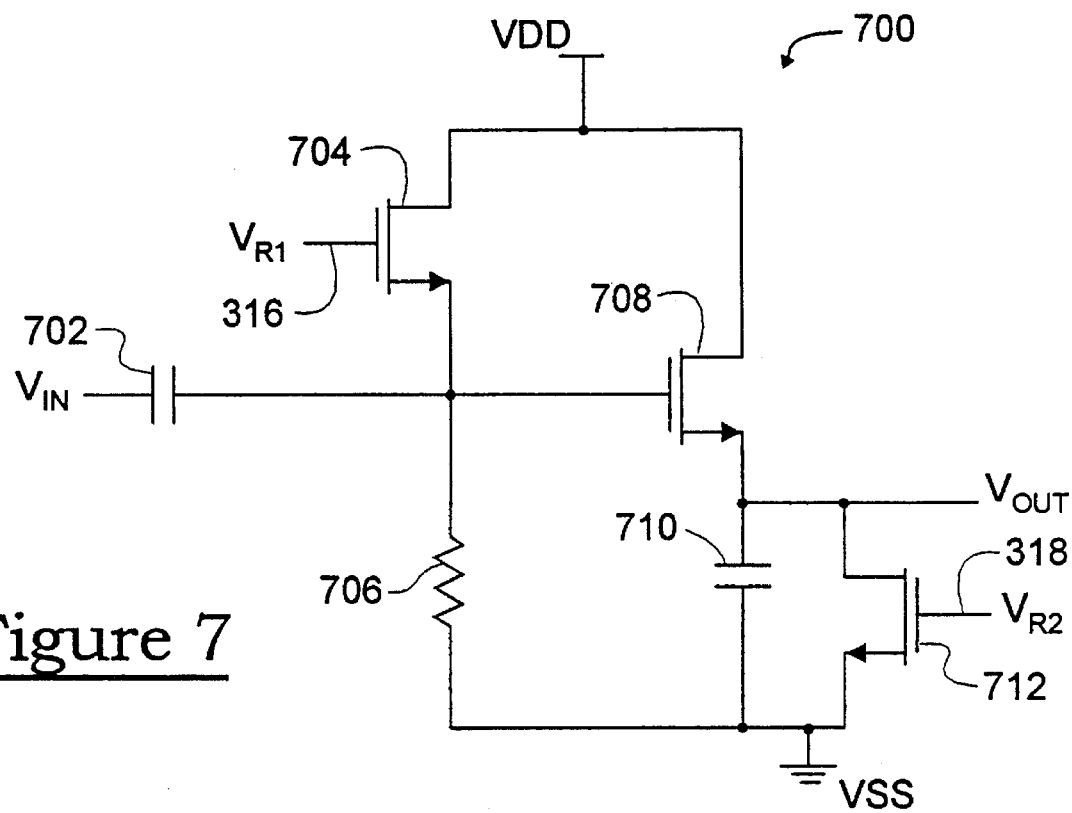
FIG. 7 is a schematic diagram of a further embodiment of a peak-to-peak voltage detector using N-Channel transistors, according to the invention.

FIG. 7 is a schematic diagram of another embodiment of a peak-to-peak voltage detector 700 using N-Channel transistors which is identical to the peak-to-peak detector 600 of FIG. 6 in all respects except that the resistor 612 in FIG. 6 is replaced with a constant current load transistor 712. A clamping portion of the circuit is implemented by an input capacitor 702, an N-Channel transistor 704 and the resistor 706. The peak-detect portion of the peak-to-peak detector 700 is similar to the peak-detect portion of the peak-to-peak detector 600 of FIG. 6, with the exception of the constant-current load transistor 712 in place of a resistor (612), and is implemented by an N-channel transistor 708, a hold capacitor 710 and the constant-current load transistor 712. Those of ordinary skill in the art will immediately recognize that the peak-to-peak detector 700 will function in much the same manner as the peak-to-peak detector 600.

Figure 8:
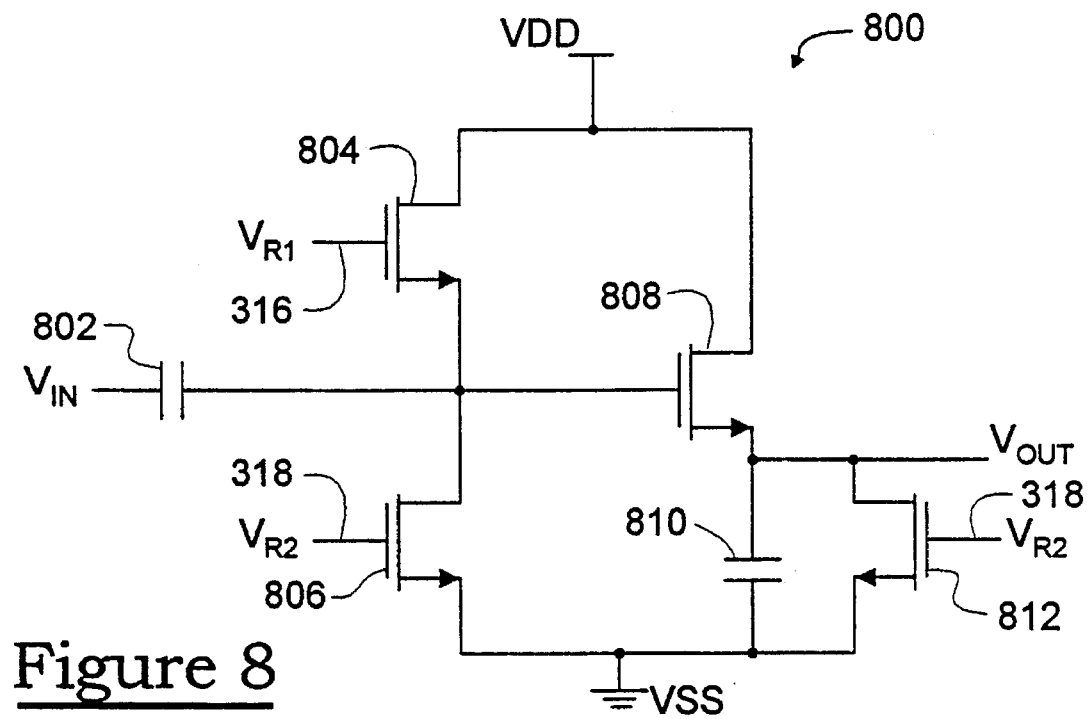
FIG. 8 is a schematic diagram of a still further embodiment of a peak-to-peak voltage detector using N-Channel transistors, according to the invention.

FIG. 8 is a schematic diagram of another embodiment of a peak-to-peak voltage detector 800 using N-Channel transistors, according to the invention, which is identical to the peak-to-peak detector 300 of FIG. 3 in all respects except that the resistor 312 is replaced with a constant current load transistor 812. A clamping portion of the circuit includes an input capacitor 802, an N-Channel transistor 804 and a constant current load transistor 806. The peak-detect portion of the peak-to-peak detector 800 is similar to the peak-detect portion of the peak-to-peak detector 300 of FIG. 3, with the exception of the constant-current load transistor 812 being in place of the resistor 312, and includes an N-channel transistor 808, a hold capacitor 810 and the constant-current load transistor 812. Those of ordinary skill in the art will immediately recognize that the peak-to-peak detector 800 will function in much the same manner as the peak-to-peak detector 300.

The embodiments described hereinabove all use N-channel transistors. Those of ordinary skill in the art will understand that, by substituting P-Channel transistors for the N-Channel transistors, and by referencing all voltages to $V_{DD}$ rather than to $V_{SS}$, equally functional, analogous P-Channel embodiments of peak-to-peak voltage detectors can be made. These P-Channel embodiments are described hereinbelow with respect to FIGS. 9–12.

Figure 9:
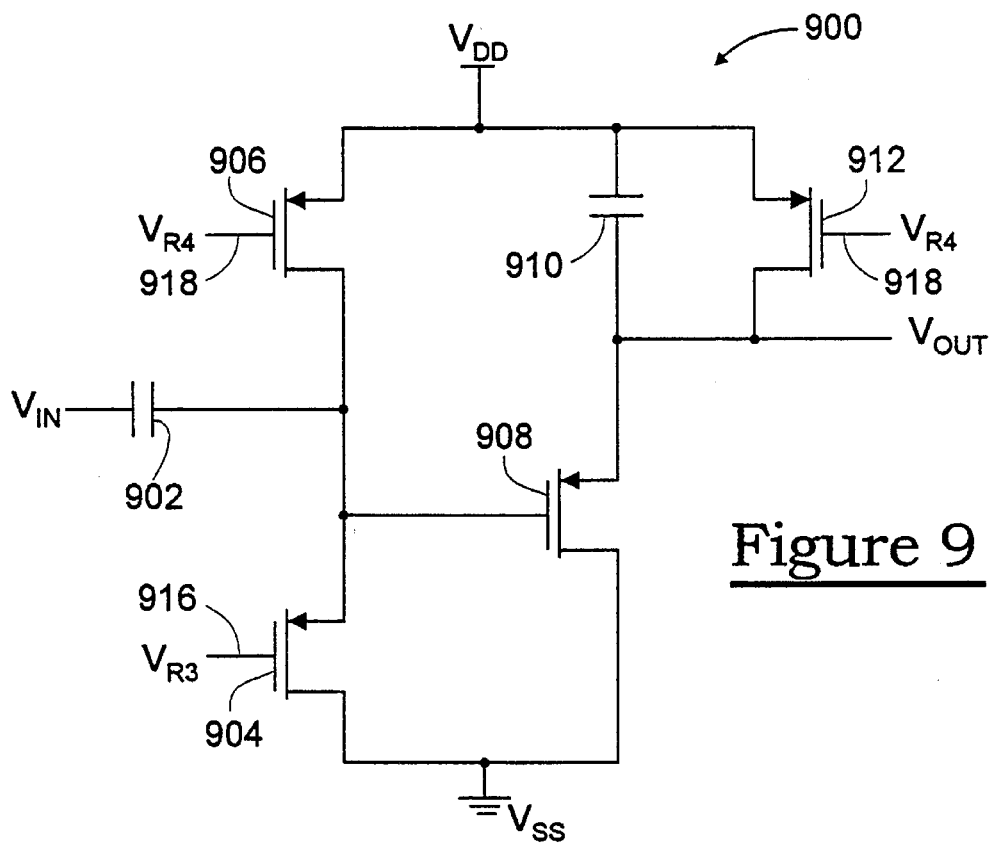
FIG. 9 is a schematic diagram of yet another embodiment of a peak-to-peak voltage detector using P-Channel transistors, according to the invention.

FIG. 9 is a schematic diagram of another embodiment of a peak-to-peak voltage detector using P-Channel transistors, according to the invention, and uses two transistors (one as an active load) in the clamp circuit and two transistors (one as an active load) in the peak-detect circuit. The peak-to-peak voltage detector 900 is a P-Channel analog of the peak-to-peak voltage detector 800 described hereinabove with respect to FIG. 8, and functions in exactly the same manner. The input and output voltages $V_{IN}$ and $V_{OUT}$ are measured relative to $V_{DD}$, however, and as a result, the peak-to-peak detector 900 appears much like an upside-down (as depicted) version of the peak-to-peak detector 800 shown and described hereinabove with respect to FIG. 8. With respect to FIGS. 9 and 8, input capacitor 902 is analogous to input capacitor 802, P-channel transistors 904 and 906 are analogous to N-channel transistors 804 and 806, respectively, P-channel transistor 908 is analogous to N-channel transistor 808, hold capacitor 910 is analogous to hold capacitor 810, and P-channel transistor 812 is analogous to N-channel transistor 812. Reference voltages $V_{R3}$ on input line 916 and $V_{R4}$ on input line 918 are comparable to reference voltages $V_{R1}$ and $V_{R2}$, respectively, but are referenced to $V_{DD}$ rather than to $V_{SS}$. One of ordinary skill in the art will immediately recognize that the peak-to-peak voltage detector 900 of FIG. 9 is essentially a polarity-reversed version of the peak-to-peak voltage detector 800 of FIG. 8, and will perform comparably.

Figure 10:
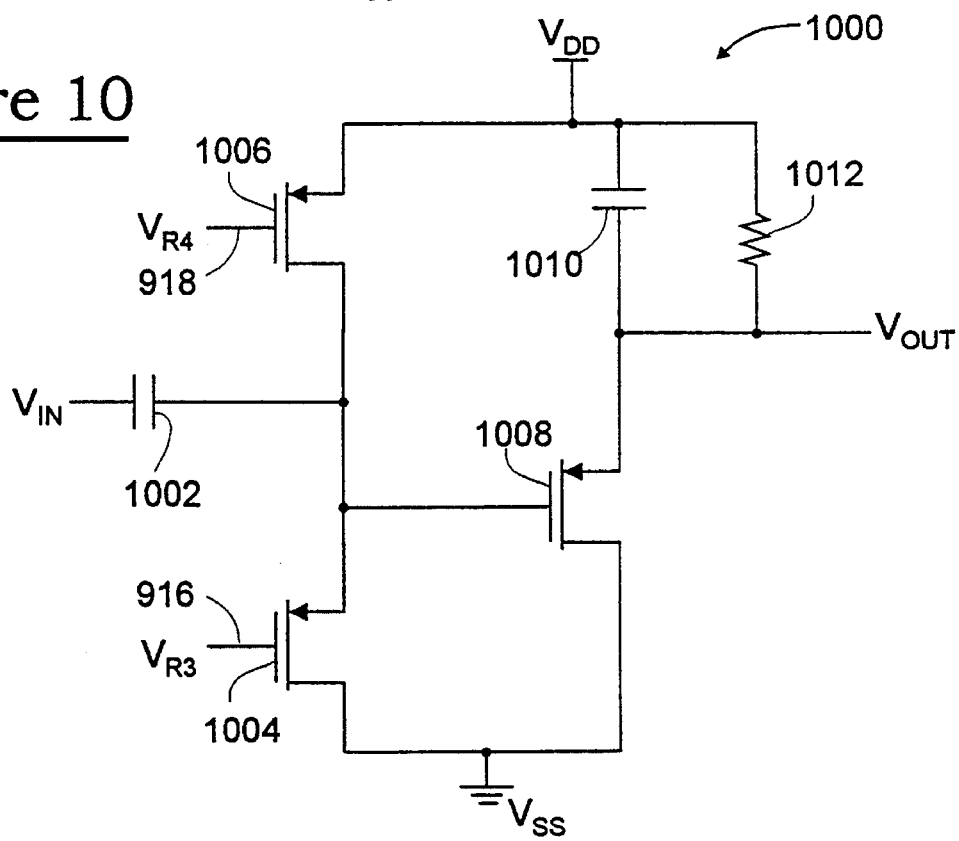
FIG. 10 is a schematic diagram of another embodiment of a peak-to-peak voltage detector using P-Channel transistors, according to the invention.

FIG. 10 is a schematic diagram of another embodiment of a peak-to-peak voltage detector using P-Channel transistors, according to the invention, using two transistors in the clamp circuit and a transistor and a load resistor in the peak-detect circuit. The peak-to-peak voltage detector 1000 is a P-Channel analog of the peak-to-peak voltage detector 300 described hereinabove with respect to FIG. 3, and functions in exactly the same manner. As with the peak-to-peak voltage detector 900 of FIG. 9, the input and output voltages $V_{IN}$ and $V_{OUT}$ are measured relative to $V_{DD}$. With respect to FIGS. 10 and 3, input capacitor 1002 is analogous to input capacitor 302, P-channel transistors 1004 and 1006 are analogous to N-channel transistors 304 and 306, respectively, P-channel transistor 1008 is analogous to N-channel transistor 308, hold capacitor 1010 is analogous to hold capacitor 310, and resistor 1012 is analogous to resistor 312. As with the peak-to peak detector 900 of FIG. 9, reference voltages $V_{R3}$ on input line 916 and $V_{R4}$ on input line 918 of FIG. 10 are cyomparable to reference voltages $V_{R1}$ and $V_{R2}$, respectively, but are referenced to $V_{DD}$ rather than to $V_{SS}$. One of ordinary skill in the art will immediately recognize that the peak-to-peak voltage detector 1000 of FIG. 10 is essentially a polarity-reversed version of the peak-to-peak voltage detector 300 of FIG. 3, and will perform comparably.

Figure 11:
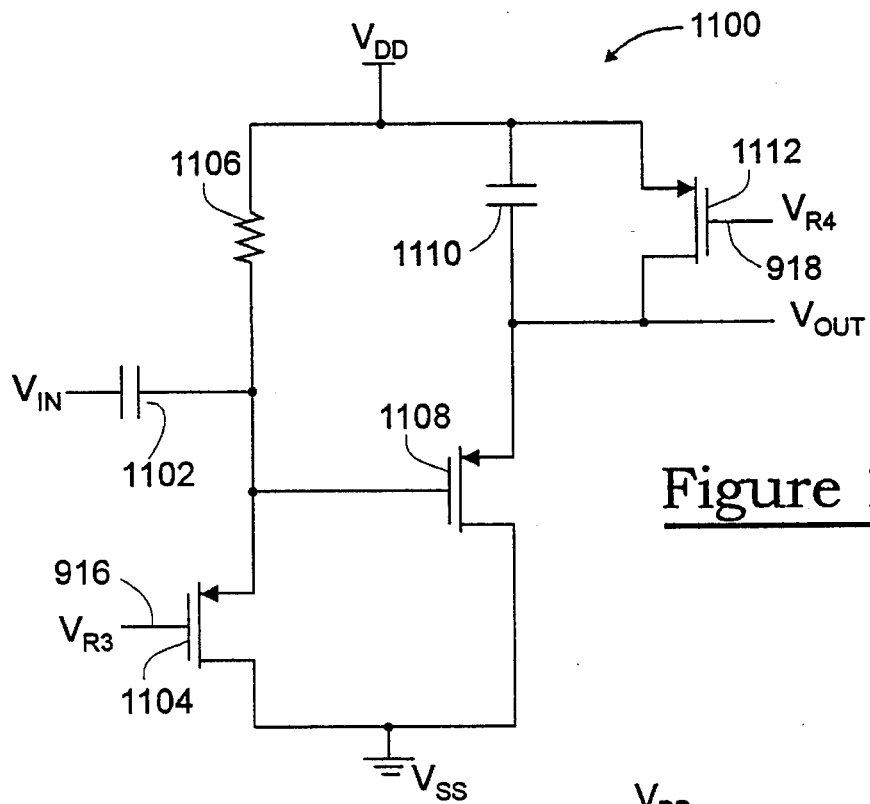
FIG. 11 is a schematic diagram of another embodiment of a peak-to-peak voltage detector using P-Channel transistors, according to the invention.

FIG. 11 is a schematic diagram of another embodiment of a peak-to-peak voltage detector using P-Channel transistors, according to the invention, using one transistor and a load resistor in the clamp circuit, and using two transistors in the peak-detect circuit. The peak-to-peak voltage detector 1100 is a P-Channel analog of the peak-to-peak voltage detector 700 described hereinabove with respect to FIG. 7, and functions in exactly the same manner. As with the peak-to-peak voltage detector 900 of FIG. 9, the input and output voltages $V_{IN}$ and $V_{OUT}$ are measured relative to $V_{DD}$. With respect to FIGS. 11 and 7, input capacitor 1102 is analogous to input capacitor 702, P-channel transistor 1104 is analogous to N-channel transistor 704, resistor 1106 is analogous to resistor 706, P-channel transistor 1108 is analogous to N-channel transistor 708, hold capacitor 1110 is analogous to hold capacitor 710, and P-channel transistor 1112 is analogous to N-channel transistor 712. As with the peak-to peak detector 900 of FIG. 9, reference voltages $V_{R3}$ on input line 916 and $V_{R4}$ on input line 918 of FIG. 11 are comparable to reference voltages $V_{R1}$ and $V_{R2}$, respectively, but are referenced to $V_{DD}$ rather than to $V_{SS}$. One of ordinary skill in the art immediately recognize that the peak-to-peak voltage detector 1100 of FIG. 11 is essentially a polarity-reversed version of the peak-to-peak voltage detector 700 of FIG. 7, and will perform comparably.

Figure 12:
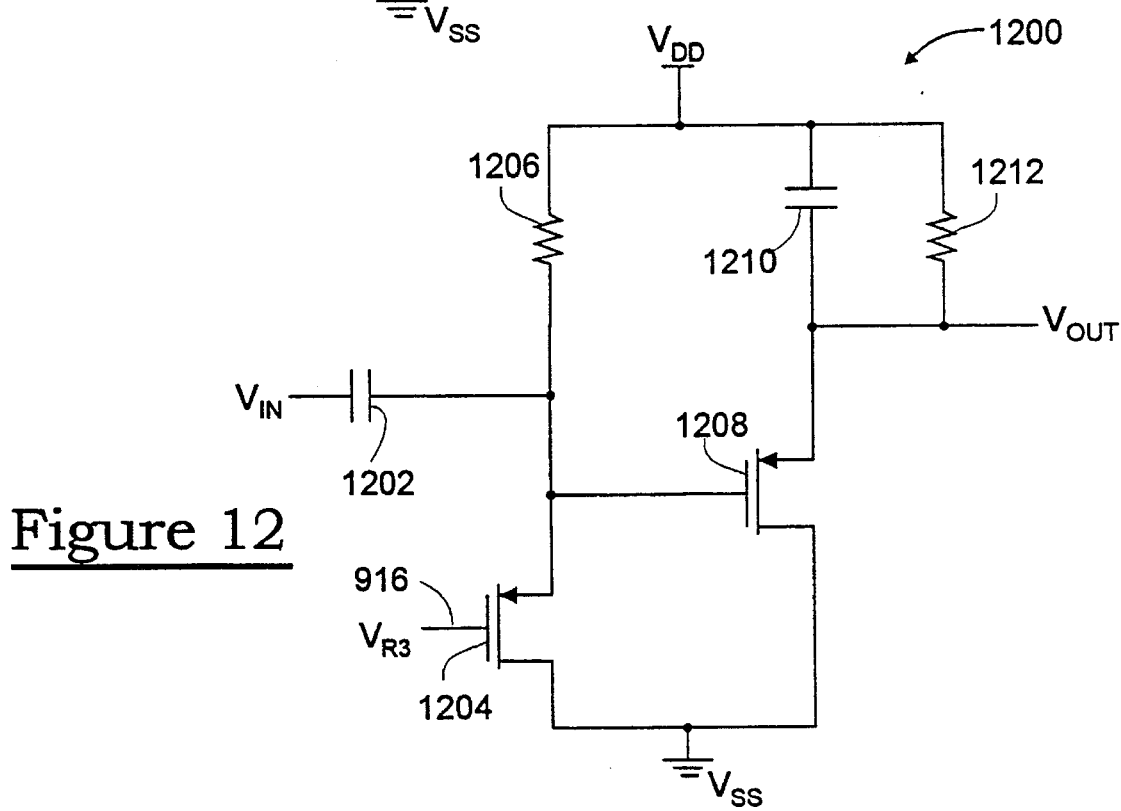
FIG. 12 is a schematic diagram of another embodiment of a peak-to-peak voltage detector using P-Channel transistors, according to the invention.

FIG. 12 is a schematic diagram of another embodiment of a peak-to-peak voltage detector using P-Channel transistors, according to the invention, using one transistor and a load resistor in the clamp circuit, and using one transistor and a load resistor in the peak-detect circuit. The peak-to-peak voltage detector 1200 is a P-Channel analog of the peak-to-peak voltage detector 600 described hereinabove with respect to FIG. 6, and functions in exactly the same manner. As with the peak-to-peak voltage detector 900 of FIG. 9, the input and output voltages $V_{IN}$ and $V_{OUT}$ are measured relative to $V_{DD}$. With respect to FIGS. 12 and 6, input capacitor 1202 is analogous to input capacitor 602, P-channel transistor 1204 is analogous to N-channel transistor 604, resistor 1206 is analogous to resistor 606, P-channel transistor 1208 is analogous to N-channel transistor 608, hold capacitor 1210 is analogous to hold capacitor 610, and resistor 1212 is analogous to resistor 612. As with the peak-to peak detector 900 of FIG. 9, reference voltages $V_{R3}$ on input line 916 and $V_{R4}$ on input line 918 of FIG. 12 are comparable to reference voltages $V_{R1}$ and $V_{R2}$, respectively, but are referenced to $V_{DD}$ rather than to $V_{SS}$. One of ordinary skill in the art will immediately recognize that the peak-to-peak voltage detector 1200 of FIG. 12 is essentially a polarity-reversed version of the peak-to-peak voltage detector 600 of FIG. 6, and will perform comparably.

Figure 13:
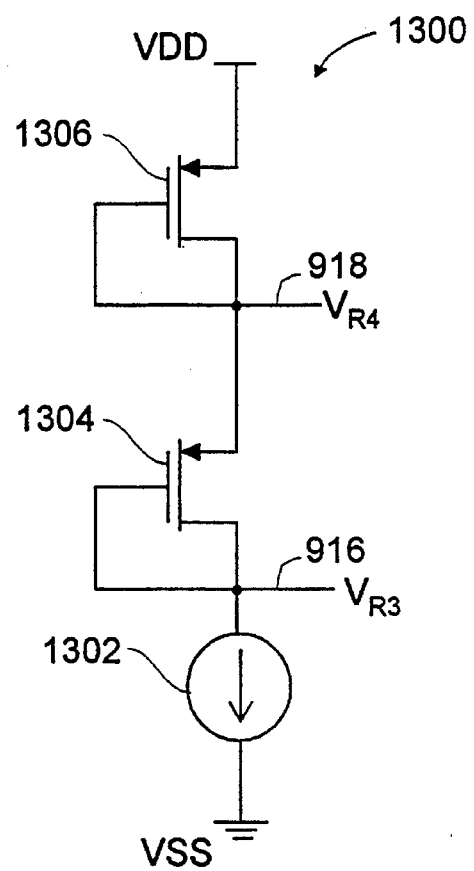
FIG. 13 is a schematic diagram of bias voltage generator for the P-Channel peak-to-peak detector embodiments such as are shown in FIGS. 9, 10, 11, and 12, according to the invention.

FIG. 13 is a schematic diagram of bias voltage generator 1300 for the peak-to-peak detector embodiments of FIGS. 9, 10, 11, and 12, according to the invention, and is essentially a P-Channel, polarity-reversed version of the bias voltage generator 500 shown and described hereinabove with respect to FIG. 5. Comparing FIGS. 13 and 5, the constant current generator 1302 is analogous to the constant current generator 502, and P-Channel transistors 1304 and 1306 are analogous to N-channel transistors 504 and 506, respectively. Reference voltages $V_{R3}$ on input line 916 and $V_{R4}$ on input line 918 of FIG. 13 are comparable to reference voltages $V_{R1}$ and $V_{R2}$, respectively, but due to polarity-reversal of the P-Channel-based reference voltage generator 1300, they are referenced to $V_{DD}$ (rather than to $V_{SS}$ as in FIG. 5).

Figure 14:
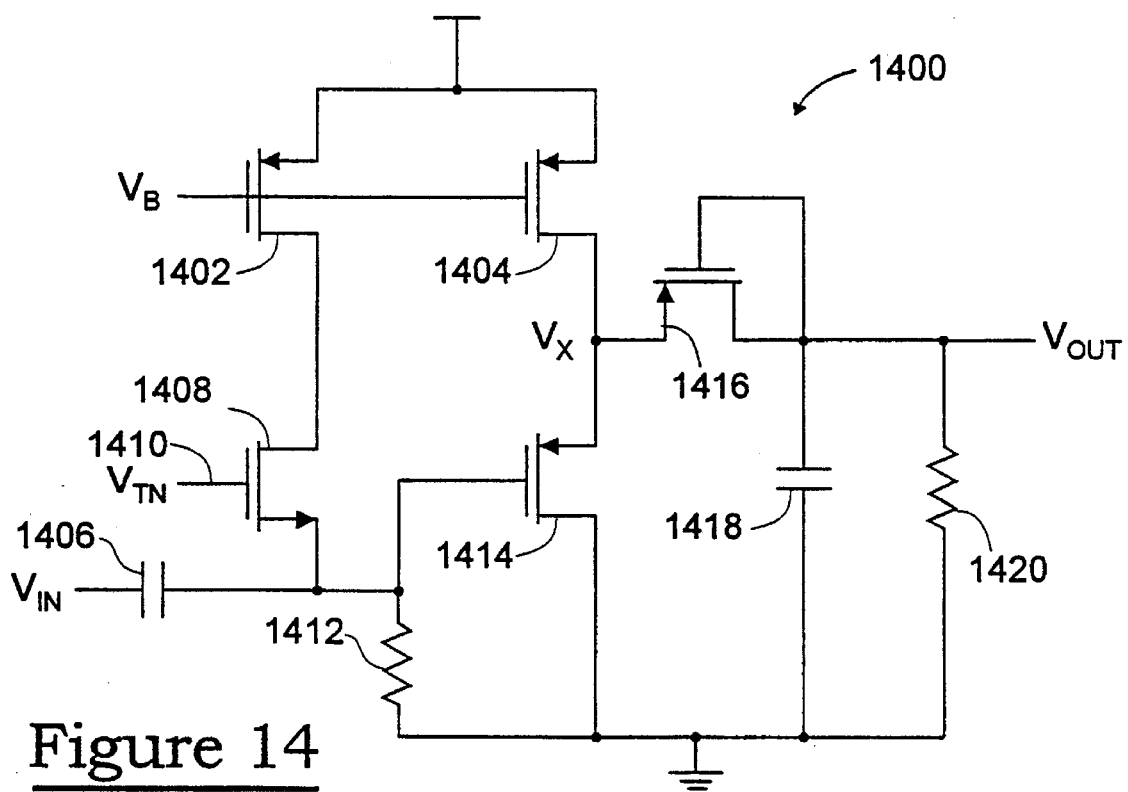
FIG. 14 is a schematic diagram of another embodiment of a peak-to-peak voltage detector using N-Channel and P-Channel transistors, according to the invention.

FIG. 14 is a schematic diagram of another embodiment of a peak-to-peak voltage detector 1400 using N-Channel and P-Channel transistors. Two P-channel transistors 1402 and 1404 provide matched, first and second bias currents, respectively, for operation of a clamp portion and a peak-detector (peak-following) portion, respectively, of the peak-to-peak voltage detector 1400. A constant bias voltage $V_B$ controls the bias currents in the two transistors 1402 and 1404. The clamp portion of the peak-to-peak voltage detector 1400 includes an input capacitor 1406, an N-channel transistor 1408 and a resistor 1412. The transistor 1408 clamps the voltage at its source to not less than one gate-threshold voltage below a reference voltage 1410 $V_{TN}$ at its gate. A reference voltage 1410 $V_{TN}$, supplied on the line 1410 to the gate of the transistor 1408, is selected to be equal to the gate threshold voltage of transistor 1408 so that transistor 1408 clamps the voltage at its source to zero volts (ground), thereby effectively eliminating any DC offset voltage in the clamped voltage appearing across resistor 1412. Any AC component of an input signal voltage $V_{IN}$ appears across the resistor 1412. The peak-following portion of the peak-to-peak detector 1400 includes a P-channel transistor 1414, a P-channel transistor 1416, a hold capacitor 1418 and a resistor 1420. The P-channel transistor 1414 acts as a voltage follower to which is supplied a bias current by the transistor 1404 to provide a voltage $V_X$ which is offset by one P-channel gate-threshold voltage above the voltage across the resistor 1412. The P-channel transistor 1416 acts as a peak follower by passing current to the hold capacitor 1418 and resistor 1420 only when the voltage $V_X$ exceeds a voltage $V_{OUT}$ across the hold capacitor 1418 and resistor 1420 by more than one P-channel gate threshold voltage. In addition to providing a peak-following function, transistor 1416 provides a voltage drop (one P-channel gate threshold voltage) to effectively cancel out the threshold voltage offset added by the transistor 1414 to provide a ground-referenced peak-to-peak output voltage without substantial offset. The output of the peak-to-peak voltage detector 1400 is labelled $V_{OUT}$, in the manner of the previously-described embodiments.

Although the invention has been illustrated and described in detail in the drawings and foregoing description, the same is to be considered as illustrative and not restrictive in character—it being understood that only preferred embodiments have been shown and described. Various modifications thereto will be readily apparent to one with ordinary skill in the art. For example, in the embodiment of FIG. 14, all of the transistors could be reversed in polarity (i.e., by substituting P-Channel transistors for the N-Channel transistors, and vice-versa). All such modifications are intended to fall within the scope of the present invention as defined by the following claims.

What is claimed is:

1. Peak-to-peak voltage detector comprising:
   a clamp circuit including:
   an input receiving an input signal having an alternating current component with a peak-to-peak magnitude,
   a first capacitor receiving the input signal and outputting a first voltage on a line in response to the input signal,
   a first transistor coupled to the line,
   means for providing a first reference voltage to an input of said first transistor, and
   a first resistive element coupled to the line; and
   a peak-detect circuit including:
   a second transistor coupled to the line to receive the first voltage output by said first capacitor, said second transistor having an output terminal providing a second voltage on an output line, a second capacitor coupled to the output line, a second resistive element coupled to the output line, and the output terminal being connectable to a reference potential only through said second capacitor and said second load element;

wherein the second voltage on the output line corresponds to the peak-to-peak magnitude of the alternating current component of the input signal.

2. Peak-to-peak voltage detector according to claim 1, wherein the first resistive element is a third transistor.

3. Peak-to-peak voltage detector according to claim 1, wherein the first resistive element is a resistor.

4. Peak-to-peak voltage detector according to claim 1, wherein the second resistive element is a third transistor.

5. Peak-to-peak voltage detector according to claim 1, wherein the second resistive element is a resistor.

6. Peak-to-peak voltage detector according to claim 1, wherein:

said first transistor is an N-Channel transistor having a source terminal connected to the line;

said first resistive element is an N-Channel transistor having a drain terminal connected to the line;

said second transistor is an N-Channel transistor having a gate terminal connected to the line and having a source terminal connected to the output line; and said second resistive element is a resistor connected in parallel with the second capacitor, and one end of said resistor and one end of said second capacitor are connected to the source terminal of the second transistor.

7. Peak-to-peak voltage detector according to claim 1, wherein:

said first transistor is an N-Channel transistor having a source terminal connected to the line;

said first resistive element is a resistor;

said second transistor is an N-Channel transistor having a gate terminal connected to the line and having a source terminal connected to the output line; and said second resistive element is a resistor connected in parallel with the second capacitor, and one end of said resistor and one end of said second capacitor are connected to the source terminal of the second transistor.

8. Peak-to-peak voltage detector according to claim 1, wherein:

said first transistor is an N-Channel transistor having a source terminal connected to the line said first resistive element is a resistor;

said second transistor is an N-Channel transistor having a gate terminal connected to the line and having a source terminal connected to the output line; and said second resistive element is a third N-Channel transistor connected by a source terminal and a drain terminal in parallel with the second capacitor, and having is drain terminal connected o the source terminal of the second transistor.

9. Peak-to-peak voltage detector according claim 1, wherein:

said first transistor is an N-Channel transistor having a source terminal connected to the line;

said first resistive element is a third N-Channel transistor having a drain terminal connected to the line;

said second transistor is an N-Channel transistor having a gate terminal connected to the line and having a source terminal connected to the output line; and said second resistive element is a fourth N-Channel transistor connected by a source terminal and a drain terminal in parallel with the second capacitor, and having its drain terminal connected to the source terminal of the second transistor.

10. Peak-to-peak voltage detector according to claim 1, wherein:

said first transistor is a P-Channel transistor having a source terminal connected to the line;

said first resistive element is a P-Channel transistor having a drain terminal connected to the line;

said second transistor is a P-Channel transistor having a gate terminal connected to the line and having a source terminal connected to the output line; and said second resistive element is a resistor connected in parallel with the second capacitor, and one end of said resistor and one end of said second capacitor are connected to the source terminal of the second transistor.

11. Peak-to-peak voltage detector according to claim 1, wherein:

said first transistor is a P-Channel transistor having a source terminal connected to the line;

said first resistive element is a resistor;

said second transistor is a P-Channel transistor having a gate terminal connected to the line and having a source terminal connected to the output line; and said second resistive element is a resistor connected in parallel with the second capacitor, and one end of said resistor and one end of said second capacitor are connected to the source terminal of the second transistor.

12. Peak-to-peak voltage detector according to claim 1, wherein:

said first transistor is a P-Channel transistor having a source terminal connected to the line;

said first resistive element is a resistor;

said second transistor is a P-Channel transistor having a gate terminal connected to the line and having a source terminal connected to the output line; and said second resistive element is a third P-channel transistor connected by a source terminal and a drain terminal in parallel with the second capacitor, and having its drain terminal connected to the source terminal of the second transistor.

13. Peak-to-peak voltage detector according to claim 1, wherein:

said first transistor is a P-Channel transistor having a source terminal connected to the line;

said first resistive element is a third P-Channel transistor having a drain terminal connected to the line;

said second transistor is a P-Channel transistor having a gate terminal connected to the line and having a source terminal connected to the output line; and said second resistive element is a fourth P-Channel transistor connected by a source terminal and a drain terminal in parallel with the second capacitor, and having its drain terminal connected to the source terminal of the second transistor.

14. Peak-to-peak voltage detector according to claim 1, wherein:

said first transistor has a gate as said input thereof, and said first reference voltage is provided to said gate of said first transistor.

15. Peak-to-peak voltage detector according to claim 1, wherein:

said first resistive element is a third transistor having a gate;

said first transistor has a gate as said input thereof; and said first reference voltage is provided to said gate of said first transistor; and further comprising:

means for providing a second reference voltage to said gate of said third transistor.

16. Peak-to-peak voltage detector, comprising:

a clamp circuit including:

an input line receiving an input signal having an alternating current component with a peak-to-peak magnitude, a first capacitor coupled to said input line for receiving said input signal and coupled to a clamp circuit output line for outputting a first voltage on said clamp circuit output line in response to said input signal, a first transistor coupled to said clamp circuit output line, means for providing a first reference voltage to an input of said first transistor, and a first resistive element coupled to said clamp circuit output line; and a peak-detect circuit including:

a second transistor with a gate coupled to said clamp circuit output line to follow said voltage output by said first capacitor on said clamp circuit output line, a second capacitor, a second resistive element connected in parallel with said second capacitor, a peak-detect output line to which one end of said second capacitor and one end of said second load element are coupled, a third transistor coupled between said second transistor and said peak-detect output line, said third transistor having an output terminal coupled to said peak-detect output line; and the output terminal being connectable to a reference potential only through said second capacitor and said second load element;

wherein a voltage on said peak-detect output line corresponds to said peak-to-peak magnitude of said alternating current component of said input signal.

17. Peak-to-peak voltage detector according to claim 16, wherein:

said first transistor has a gate as said input thereof, and said means for providing includes a voltage reference line providing said first reference to said gate of said first transistor.

18. Peak-to-peak voltage detector according to claim 17, wherein the reference voltage is selected to be equal to a gate threshold voltage of said first transistor.

19. Peak-to-peak voltage detector according to claim 16, wherein said first resistive element is a second resistor and said second resistive element is a second resistor.

* * * * *